US006685849B2

(12) United States Patent
Eitel et al.

(10) Patent No.: US 6,685,849 B2
(45) Date of Patent: Feb. 3, 2004

(54) PEROVSKITE MATERIALS FOR HIGH TEMPERATURE AND HIGH PERFORMANCE ACTUATORS AND TRANSDUCERS

(75) Inventors: Richard E. Eitel, State College, PA (US); Seung-Eek Park, Miramar, FL (US); Clive A. Randall, State College, PA (US); Thomas R. Shrout, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 195 days.

(21) Appl. No.: 09/854,927

(22) Filed: May 14, 2001

(65) Prior Publication Data

US 2003/0031622 A1 Feb. 13, 2003

(51) Int. Cl.[7] .............................................. C09K 35/472
(52) U.S. Cl. ................................ 252/62.9 R; 501/152; 501/134; 501/135; 501/136
(58) Field of Search ..................... 252/62.9 R; 501/152, 501/134, 135, 136

(56) References Cited

U.S. PATENT DOCUMENTS

| | | | |
|---|---|---|---|
| 3,533,951 A | * 10/1970 | Tsubouchi et al. | 252/62.9 PZ |
| 3,994,823 A | * 11/1976 | Ainger et al. | 252/625 |
| 4,059,537 A | * 11/1977 | Espinosa | 252/62.9 PZ |
| 5,804,907 A | 9/1998 | Park et al. | 310/358 |
| 5,998,910 A | 12/1999 | Park et al. | 310/358 |

OTHER PUBLICATIONS

Shannon. "Revised effective inonic ridii and systematic studies of interatomic distances in Halides and Chalcogenides." Acta Cryst. (1976), A 32, pp. 751–767.

Paik et al. "E–field induced phase transition in (001)–oriented rhombohedral $0.92Pb(Zn_{1/3}Nb_{2/3})O_3$–$0.08PbTiO_3$ crystals." Journal of Applied Physics. vol. 85, No. 2, Jan. 15, 1999, pp. 1080–1083.

Park et al. "Crystallographically engineered $BaTiO_3$ single crystals for high–performance piezoelectrics." Journal of Applied Physics. vol. 86, No. 5, Sep. 1, 1999, pp. 2746–2750.

Park et al. "Ultrahigh strain and piezoelectric behavior in relaxor based ferroelectric single crystals." J. Appl. Phys. 82 (4), Aug. 15, 1997, pp. 1804–1811.

Shrout et al. "Preparation of lead–based ferroelectric relaxors for capacitors." Am. Ceram. Soc. Bull., 66 (4) 704–711 (1987).

Abrahams et al. "Atomic displacement relationship to Curie temperature and spontaneous polarization in displacive ferroelectrics." Physical Review. vol. 172, No. 2, Aug. 10, 1968, pp. 551–553.

(List continued on next page.)

Primary Examiner—C. Melissa Koslow
(74) Attorney, Agent, or Firm—Ohlandt, Greeley, Ruggiero & Perle, L.L.P.

(57) ABSTRACT

The present invention is directed to a new family of high Curie temperature, morphotropic phase boundary systems, based on the perovskite solid solution having the general formula $(1-x)BiMeO_3$-$xPbTiO_3$, where Me is a suitably sized cation or combination of cations and x is a molar fraction. The perovskite systems of the present invention offer room temperature properties analogous to, and high temperature properties superior to, commercially available PZT compositions. The perovskite of this invention exhibits a MPB between the rhombohedral and tetragonal phases. Further dopant strategies may be used for property optimization of the perovskite systems.

18 Claims, 6 Drawing Sheets

OTHER PUBLICATIONS

Park et al. "Crystallographic engineering in high–performance piezoelectric crystals." SPIE Annual International Symposium on Smart Structures and Materials, Mar. 1–5, 1999.

Sunder et al. "Investigation of tetragonal distortion in the $PbTiO_3$—$BiFeO_3$ system by high–temperature x–ray diffraction." J. Mater. Res., vol. 10, No. 5, May 1995, pp. 1301–1306.

Smith et al. "Dielectric properties of solid solutions of $BiFeO_3$ with $Pb(Ti, Zr)O_3$ at high temperature and high frequency." J. App. Phys. vol. 39, No. 1, Jan. 1968, pp. 70–74.

Fedulov et al. "Complete phase diagram of the $PbTiO_3$—$BiFeO_3$ system." Soviet Physics–Solid State. vol. 6, No. 2, Aug. 1964, pp. 375–378.

* cited by examiner

FIG. 1

| ABBREVIATION | S.S. END MEMBER $(1-x)ABO_3 + xPbTiO_3$ | END MEMBER TOLERANCE FACT | MPB CURIE TEMP (°C) |
|---|---|---|---|
| PMW | $Pb(Mg,W)O_3$ | 0.993 | 60 |
| PMT | $Pb(Mg,Ta)O_3$ | 0.989 | 80 |
| PNN | $Pb(Ni,Nb)O_3$ | 0.994 | 130 |
| PFN | $Pb(Fe,Nb)O_3$ | 1.001 | 140 |
| PMN | $Pb(Mg,Nb)O_3$ | 0.989 | 160 |
| PMnN | $Pb(Mn,Nb)O_3$ | 0.973 | 187 |
| PZnN | $Pb(Zn,Nb)O_3$ | 0.986 | 190 |
| PST | $Pb(Sc,Ta)O_3$ | 0.977 | 205 |
| PSn | $PbSnO_3$ | 0.978 | 220 |
| PCN | $Pb(Co,Nb)O_3$ | 0.985 | 250 |
| PSN | $Pb(Sc,Nb)O_3$ | 0.977 | 260 |
| PCW | $Pb(Co,W)O_3$ | 0.987 | 310 |
| PIN | $Pb(In,Nb)O_3$ | 0.965 | 320 |
| PH | $PbHfO_3$ | 0.969 | 340 |
| NBT | $(Na,Bi)TiO_3$ | 0.977 | 350 |
| PYN | $Pb(Yb,Nb)O_3$ | 0.951 | 360 |
| PZ | $PZrO_3$ | 0.964 | 385 |
| BS | $BiScO_3$ | 0.907 | 450 |
| BI | $BiInO_3$ | 0.884 | 560 |
| BY | $BiYbO_3$ | 0.857 | 913 |

PEROVSKITE MATERIALS FOR HIGH TEMPERATURE AND HIGH PERFORMANCE ACTUATORS AND TRANSDUCERS

This invention was made with government support under the grant N00014-98-1-0527 from the Defense Advanced Research Projects Agency, Office of Naval Research. Accordingly, the U.S. Government has certain rights in the invention.

BACKGROUND OF THE INVENTION

1. Field of the Invention

The present invention relates to a body of perovskite material engineered by combining crystallographic engineering with tolerance property relationships for enhancement of piezoelectric properties. The material exhibits a morphotropic phase boundary (MPB) between the rhombohedral and tetragonal phases. More specifically, the present invention relates to the production of a perovskite solid solution having the general formula $(1-x)BiMeO_3-xPbTiO_3$, where Me is any suitably sized cation or combination of cations and x is a molar fraction.

2. Description of Related Art

Piezoelectric sensors and actuators have experienced tremendous growth and wide spread application since the initial work with $Pb(Ti,Zr)O_3$, hereinafter "PZT", in the early 1950's. Since then, PZT-based piezoelectric devices have dominated the world market. They are widely used in underwater sonar, vibration dampening equipment, medical ultrasound transducers, high frequency buzzers and speakers, fuel injection actuators, and precision positioners. Recently there has been interest in incorporating these devices into "Smart Systems" or "Smart Structures," utilizing these device's dual nature as both a sensor and an actuator. Some proposed applications are for variable control surfaces or noise/vibration suppression in aerospace and automotive applications.

However, the current temperature limitations of PZT-based devices have restricted these types of applications. The PZT-based devices are limited by the Curie temperature ($T_C$) of these materials; the temperature indicating the complete loss of piezoelectric properties, typically less than 350° C. It is noted, however, that property degradation typically occurs at temperatures lower than the $T_C$, for example, at approximately ½ $T_C$, associated with an irreversible depoling reaction.

The dominance of PZT-based devices has been due to their anomalously high piezoelectric constant values near the MPB between rhombohedral and tetragonal phases. There exist a variety of compositional additions that can be used to tailor the properties of PZT-based piezoelectric materials. These additions result in creation of both "soft" and "hard" piezoelectric ceramics, by either donor or acceptor doping respectively, suitable for a wide range of applications. Research has not, however, provided a way to increase the Curie temperature for PZT-based materials. Additionally, no suitable alternative MPB material systems exhibiting enhanced properties and an increased $T_C$ have been developed.

Figure 1:
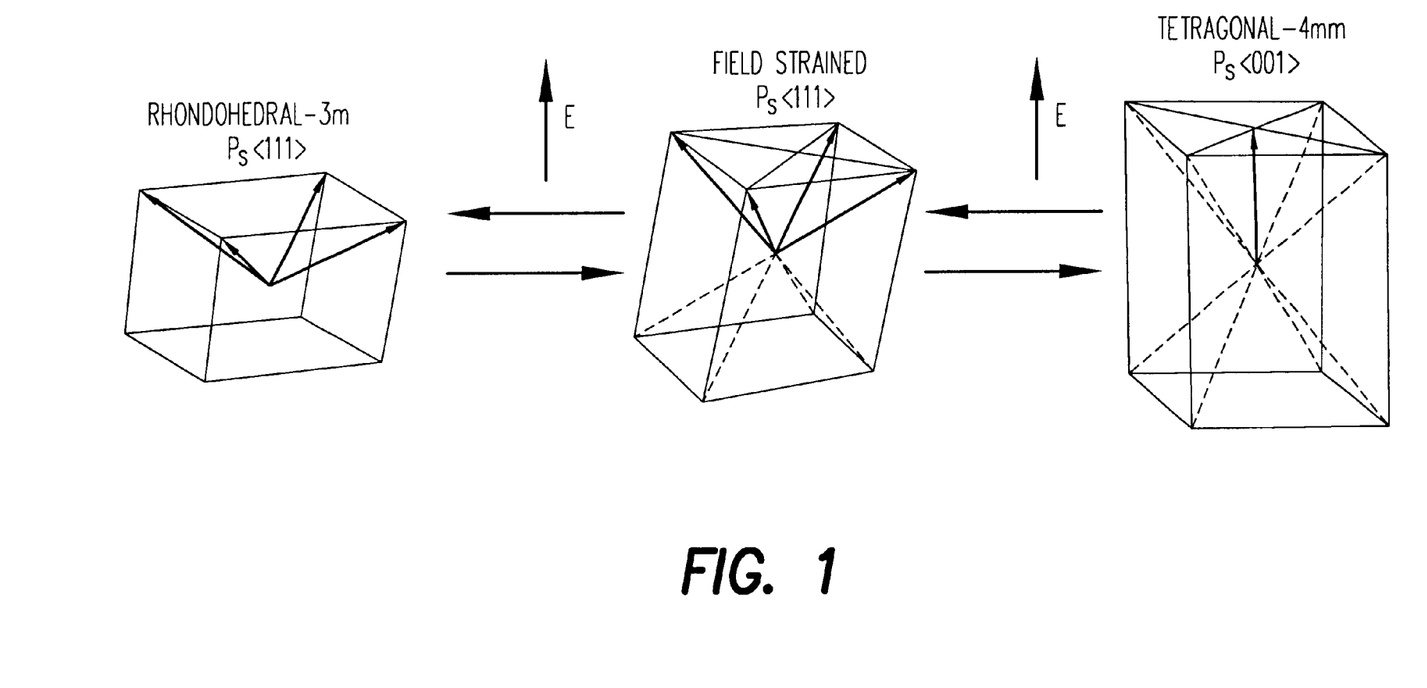
FIG. 1 illustrates the rhombohedral to tetragonal phase transformation and E-field induced strain as pertains to c/a ratio for the perovskite according to the present invention.

The use of crystallographic engineering in MPB single crystals has been well documented (Paik, D. S., et al., *E-field Induced Phase Transition in <001>-oriented Rhombohedral $0.92Pb(Zn_{1/3}Nb_{2/3})O_3-0.08PbTiO_3$ Crystals.* Journal of Applied Physics, 1999. 85(2): p. 1080–1083., Park, S. -E., et al., *Crystallographically Engineered $BaTiO_3$ Single Crystals for High Performance Piezoelectrics*, 1999, The Pennsylvania State University: University Park., Park, S. -E. and T. R. Shrout, *Ultrahigh Strain and Piezoelectric Behavior in Relaxor based Ferroelectric Single Crystals.* Journal of Applied Physics, 1997. 82(4): p. 1804-1811.). Crystallographic engineering is a concept to utilize crystal anisotrophy, as well as, an engineered domain configuration to enhance piezoelectric activity. The application of crystallographic engineering in $Pb(Zn_{1/3}Nb_{2/3})O_3-xPbTiO_3$ (PZN-PT) has resulted in single-crystal piezoelectric strain values of 2% compared to the maximum value in PZT ceramics of about 0.15%, as presented in FIG. 1. Property relationships in single crystal materials have linked these high strain values to the tetragonal lattice parameters near the MPB region. The intrinsic strain limit predicted for the PZN-PT system is given by the ratio $c/a \approx 1.02$, where c is the c lattice constant and a is the a lattice constant, approaching the measured 2% strain levels in these systems.

Research has also focused on the use of traditional crystal chemistry calculations for predicting and stabilizing new material systems. These calculations are based on the basis geometrical packing of atoms into the idealized perovskite system with the formula $ABO_3$. The calculation used is that of a tolerance factor initially proposed by Goldschmidt and using Shannon and Prewitt's Ionic Radii (Goldschmidt, V. M., *Geochemistry*. 1954, Oxford: Clarendon Press and Shannon, R. D., *Revised Effective Ionic Radii and Systematic Studies of Interatomic Distances in Halides and Chalcogenides.* Acta. Cryst., 1976. A(32): p. 751–767.). The tolerance factor for perovskites is given by the formula:

$$t = \frac{r_A + r_O}{\sqrt{2}\,(r_B + r_O)}$$

where $r_A$, $r_B$, and $r_O$ are the respective ionic radii, and t is the tolerance factor with t=1 being an ideal perovskite structure. Tolerance factor has been used as a guideline for perovskite phase stability in a number of difficult to prepare material systems (Shrout, T. R. and A. Halliyal, *Preparation of Lead-Based Ferroelectric Relaxors for Capacitors*. American Ceramics Society Bulletin, 1987. 66(7): p. 704–11.).

Figure 2:
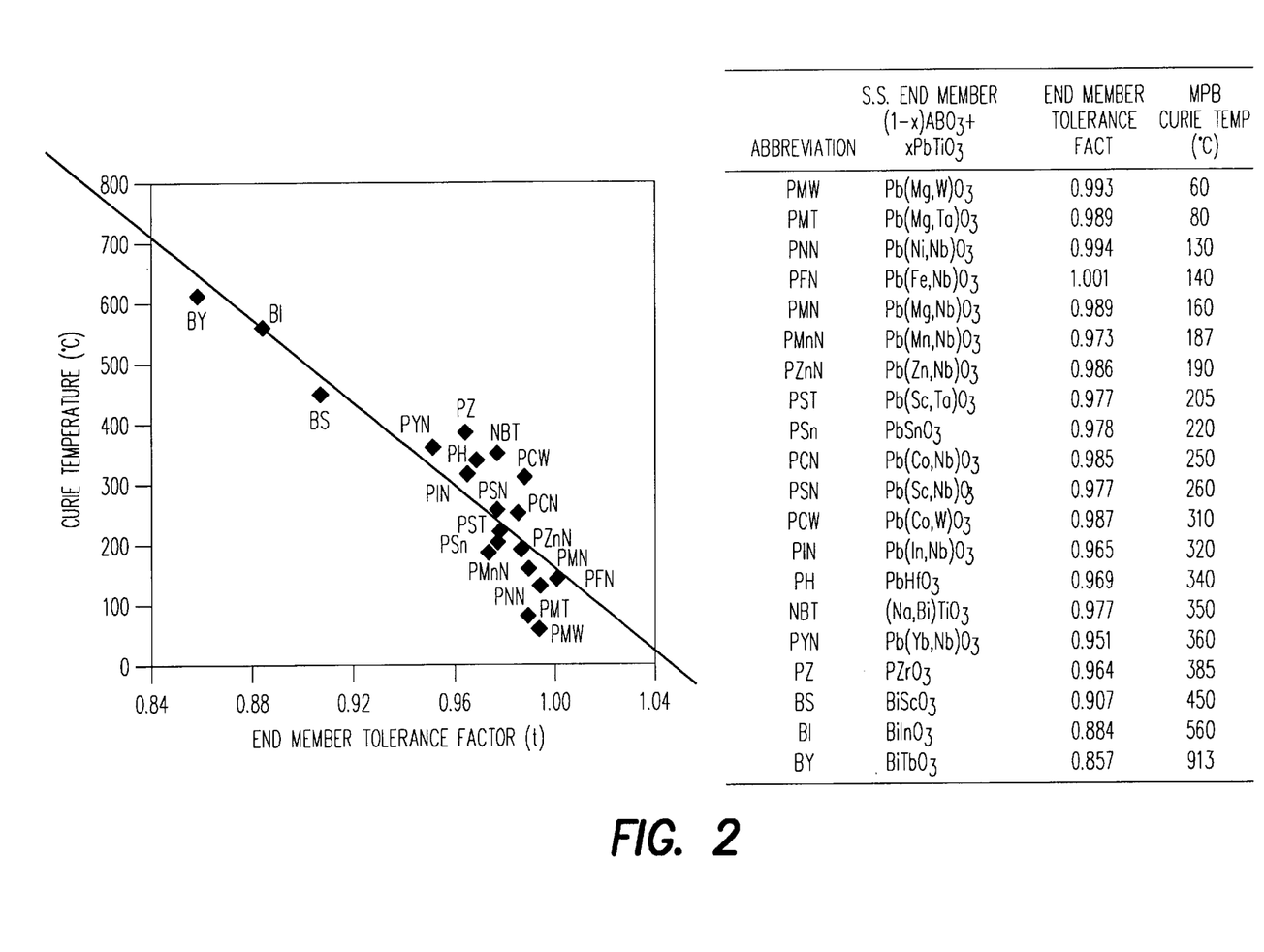
FIG. 2 is a graphical representation of Curie temperature of the MPB end member with $PbTiO_3$ as a function of tolerance factor for both prior art perovskite materials and perovskites according to the present invention.

Trends in a large number of traditional and bismuth based MPB systems have shown a link between the tolerance factor and Curie temperature. The introduction of the smaller bismuth cation and/or large B-site cation, e.g. Sc, In, Ga, Yb, lowers the tolerance factor, resulting in a significant increase in the Curie temperature of $ABO_3-PbTiO_3$ systems, as demonstrated in FIG. 2. A further consequence of an increased Curie temperature is increased tetragonality (increased c/a ratio) as originally observed by Abrahams (Abrahams, S. C., Kurtz, S. K., and Jamieson, P. B., *Atomic Displacement Relationships to Curie Temperature and Spontaneous Polarization in Displacive Ferroelectrics,* Physical Review, 1968, 172(2): p. 551–3.).

However, tolerance factor relationships have not been combined with crystallographic engineering principals to predict and formulate high temperature perovskite systems, and specifically new morphotropic phase boundary systems.

Accordingly, the perovskites of the present invention were formulated through the use of tolerance factor relationships in combination with crystallographic engineering principals. As a result, the perovskites of the present invention exhibit superior high temperature piezoelectric properties. These high temperature properties result in significant advantages in that the perovskites can be used in high temperature applications previously unavailable due to the lower temperature constraints associated with the prior art perovskites.

SUMMARY OF THE INVENTION

Figure 3:
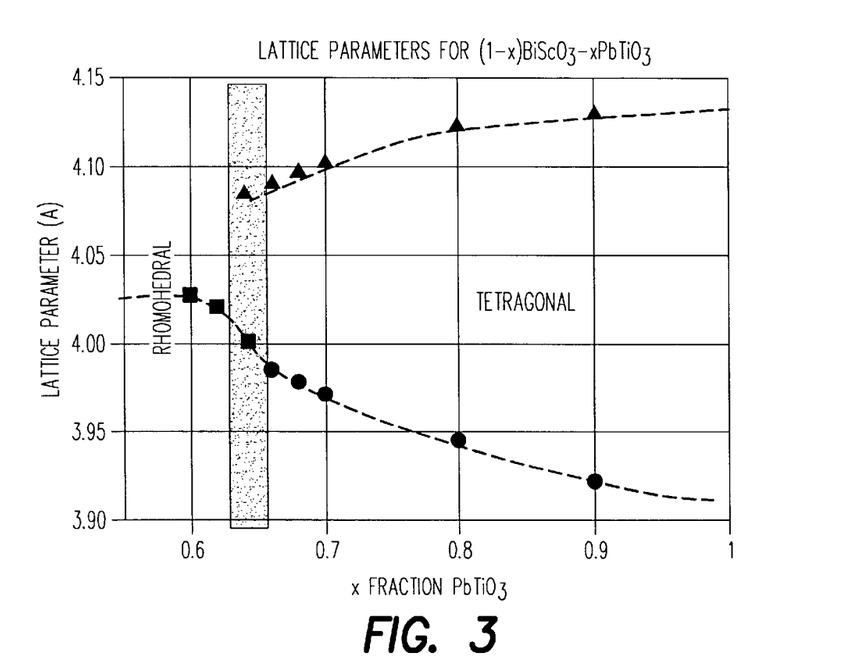
FIG. 3 is a phase diagram for the perovskite having the formula $(1-x)BiScO_3\text{-}xPT$, according to the present invention.

The present invention is directed to a new family of high $T_C$ MPB systems, based on the perovskite solid solution having the general formula $(1-x)BiMeO_3\text{-}xPbTiO_3$, where Me is at least one suitably sized cation selected from the group consisting of: scandium, indium, yttrium, ytterbium, other rare earth metals, and combinations thereof, and x is a molar fraction between about 0.50 to 0.90. The perovskite systems of the present invention offer high temperature properties superior to commercially available PZT compositions. The perovskites of this invention exhibit a MPB between the rhombohedral and tetragonal phases, as illustrated in FIG. 3. Further dopant strategies known to those skilled in the art may be used for property optimization of the perovskite systems.

The perovskite of the present invention can be prepared using any method known to those skilled in the art. By way of example, the perovskite crystals can be prepared using a conventional solid state reaction, or whereby the appropriate amount of oxides and/or carbonates, e.g., $PbCO_3$, $Bi_2O_3$, $TiO_2$, $Sc_2O_3$, etc., are weighed out and intimately mixed. This mixing is followed by calcination, which is the thermal process whereby the interdiffusion of cations and anions takes place to achieve the desired perovskite phase, as determined by x-ray diffraction. The calcined powder is subsequently milled to enhance the powder reactivity and pressed into disks for densification and electrical testing. The polycrystalline perovskite structure is exposed to the minimum electric field ($E_C$) required to achieve maximum polarization ($P_R$), i.e., maximum alignment of the poles of the polycrystalline structure, which results in optimum perovskite properties.

The perovskites of the present invention can be predicted by combining crystallographic engineering principles with basis geometrical packing of atoms in the perovskite structure. From crystallographic engineering, as described above, this increased c/a ratio will potentially result in high strain piezoelectrics, superior to already reported single crystal piezoelectrics. In perovskite ferroelectrics, the spontaneous strain is linked to the transition temperatures. The perovskites of the present invention follow this trend, and owing to their larger transition temperatures, the spontaneous strain and the associated intrinsic dielectric and electromechanical properties also show enhanced piezoelectric properties compared to typical piezoelectrics, such as, PZT. Therefore, by combining the tolerance factor relationship with crystallographic engineering principles, predictions based upon this relationship provide a method for developing new families of high Curie temperature, high strain materials utilizing traditional crystallographic calculations.

One embodiment of the present invention is directed to a perovskite of the formula $(1-x)BiScO_3\text{-}xPbTiO_3$, where x is between about 0.50 to about 0.90.

A second embodiment of the present invention is directed to a perovskite of the formula $(1-x)BiInO_3\text{-}xPbTiO_3$, where x is between about 0.50 to about 0.90.

A third embodiment of the present invention is directed to a perovskite of the formula $(1-x)BiYbO_3\text{-}xPbTiO_3$, where x is between about 0.50 to about 0.90.

All of the perovskites of the present invention exhibit a morphotropic phase boundary between a rhombohedral structure on the bismuth-rich side and a tetragonal structure on the lead-rich side.

DETAILED DESCRIPTION OF THE INVENTION

By combining crystallographic engineering and tolerance property relationships, a new family of $(1-x)BiMeO_3\text{-}xPbTiO_3$ piezoelectric materials exhibiting a MPB between the rhombohedral and tetragonal phases, has been developed. The Me of the perovskite formula may be any suitably sized cation or combination of cations. Suitably sized cations may include, for example, scandium, indium, yttrium, ytterbium, and other rare earths. Other suitably sized cations that may be used in combination include, for example, iron, gallium, magnesium, zirconium, nickel (B-site), strontium, sodium, or potassium (A-site). Perovskite systems with these cations have demonstrated Curie temperatures greater than 400° C. and high piezoelectric coefficients ($d_{33}$) of over 450 pC/N, and subsequently large strain levels and c/a ratios, even before application of further dopant strategy for property optimization.

Property optimization may be achieved by doping the perovskite with at least one element that may or may not significantly shift $T_C$. Suitable dopants include, for example, lanthanum, iron, manganese, niobium, tin, barium, and combinations thereof, and may be referred to as 'donor' and 'acceptor' additives.

Figure 4:
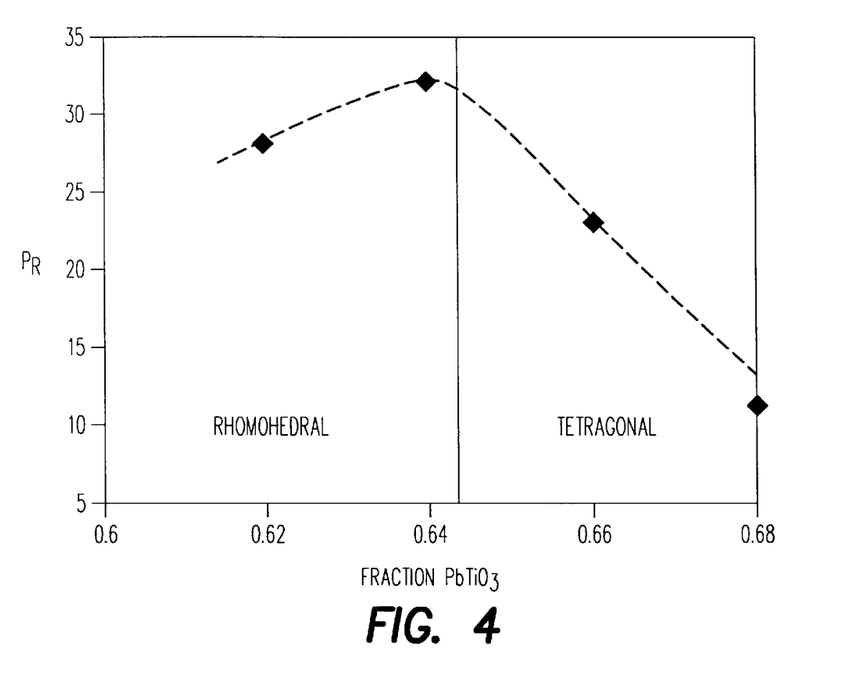
FIG. 4 is a graphical representation of remanent polarization $P_R$ as a function of lead titanate content showing enhanced polarizability in the MPB region for the perovskite having the formula $BiScO_3\text{-}xPbTiO_3$ according to the present invention.

In one embodiment of the present invention, the perovskite system is represented by the formula $(1-x)BiScO_3\text{-}xPbTiO_3$. $BiScO_3$ by itself exhibits poor perovskite phase stability as suspected from its low tolerance factor. However, the system $(1-x)BiScO_3\text{-}xPbTiO_3$ with x>0.50 molar fraction was found to form a phase pure perovskite solid solution, due to the addition of PbTiO$_3$, with a substantially larger tolerance factor. Specifically, this system exhibits a MPB between a rhombohedral structure on the bismuth-rich side and a tetragonal structure on the lead-rich side, in the region 0.62<x<0.66, as illustrated in FIG. 3. The enhanced polarizability associated with an MPB is represented by increased polarization, shown in FIG. 4. As illustrated in FIG. 4, the polarization is greater than about 30 $\mu$C/cm$^2$.

Figure 5:
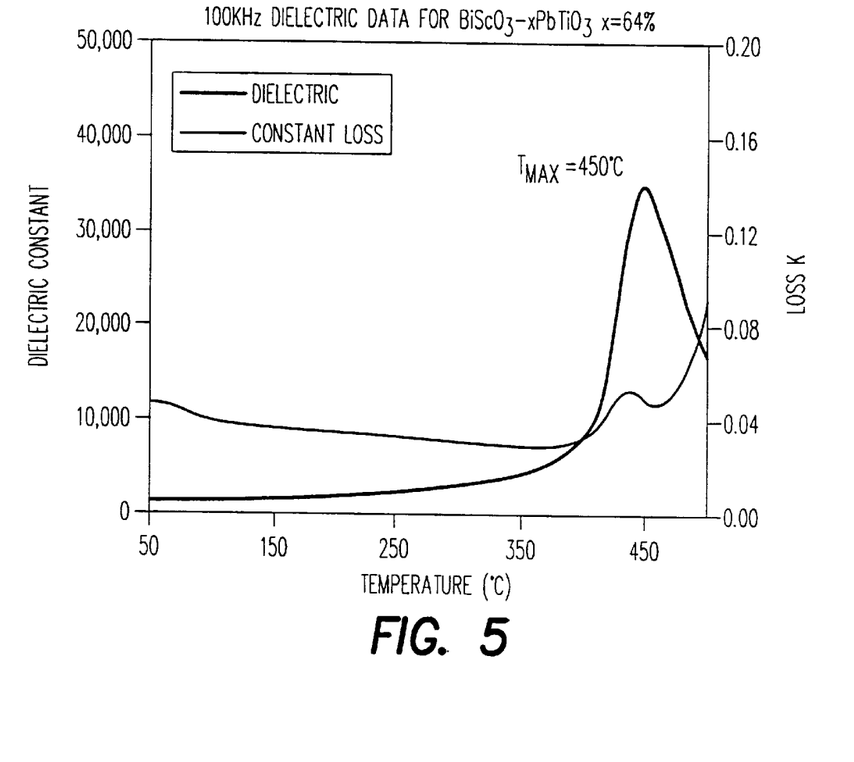
FIG. 5 is a graphical representation of the dielectric constant (100 KHz) versus temperature for the perovskite having the formula $(1-x)BiScO_3\text{-}xPbTiO_3$, where x=64% PT, according to the present invention.
Figure 6:
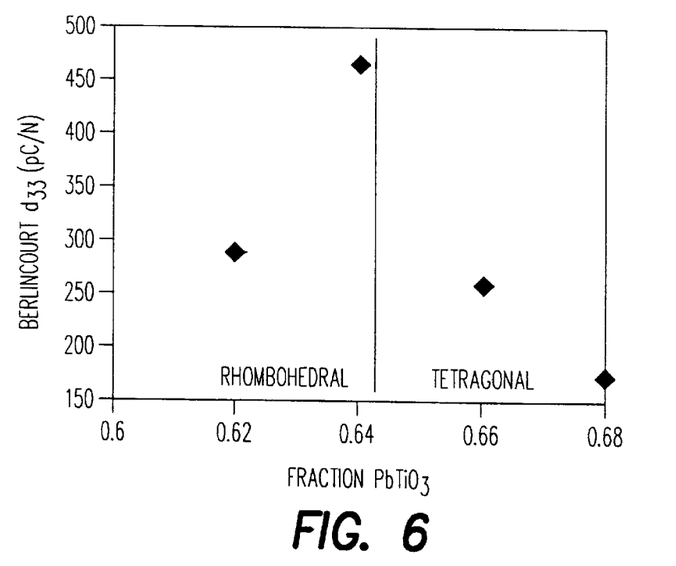
FIG. 6 is a graphical representation of the piezoelectric $d_{33}$ coefficient as obtained by a Berlincourt $d_{33}$ meter exhibiting enhancement of piezoelectric properties associated with the MPB for the perovskites according to the present invention.
Figure 7:
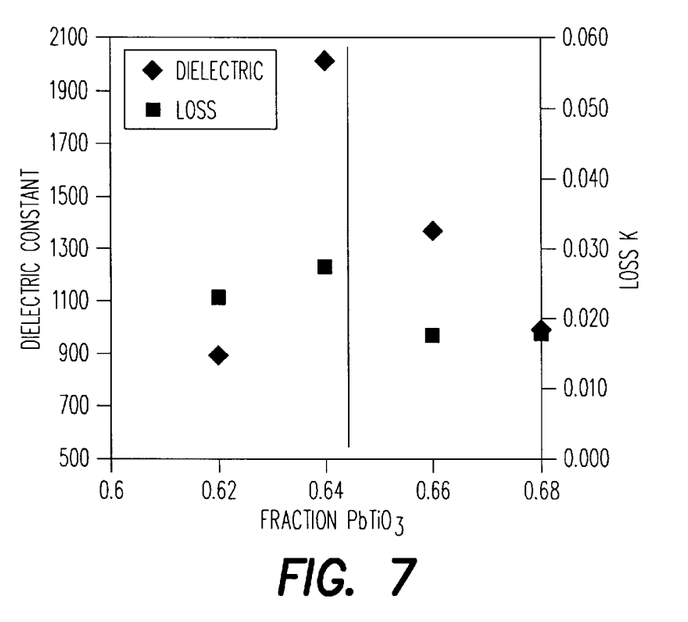
FIG. 7 is a graphical representation of the increase in the dielectric constant near the MPB in the region 60–70% PT for the perovskite having the formula $(1-x)\,BiScO_3\text{-}xPbTiO_3$ according to the present invention.
Figure 8:
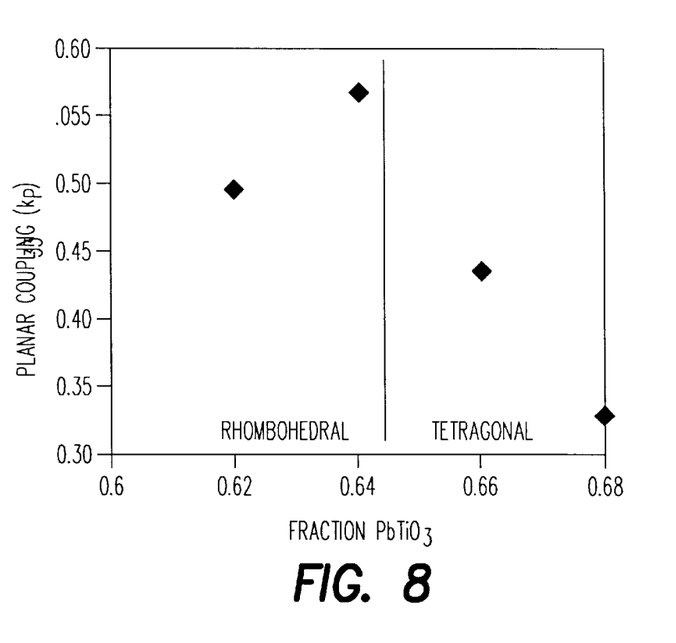
FIG. 8 is a graphical representation of the increased planar electromechanical coupling coefficient ($k_P$), measured according to IEEE standards, for the perovskite having the formula $(1-x)\,BiScO_3\text{-}xPbTiO_3$, where x=60–80% PT, according to the present invention.

The peak properties for the composition (1-x)BiScO$_3$-xPbTiO$_3$ have been found with x=0.64. This results in the perovskite having a Curie temperature of about 450° C. (see FIG. 5), which is nearly 100° C. higher than PZT systems. This increased Curie temperature is achieved while still maintaining piezoelectric properties competitive with and superior to those of PZT. The piezoelectric coefficient in the longitudinal mode (d$_{33}$) of the perovskite system having the formula 0.36 BiScO$_3$-0.64 PbTiO$_3$ is near 460 pC/N, as determined by a Berlincourt d$_{33}$ meter being enhanced at the MPB, as shown in FIG. 6. The enhancement is also evident in the dielectric constant K and electromechanical coupling (kp), shown in FIGS. 7 and 8, respectively.

Complete measured values for x=0.64 and other compositions plus a comparison with several commercially available PZTs and several alternative high temperature piezoelectric systems of the present invention, are given in Table I below. Clearly, the high temperature PZT systems all sacrifice piezoelectric properties for temperature stability, and the high piezoelectric value PZT materials are limited by lower usage temperatures. Notably, observe that previous piezoelectrics with T$_c$>400° C. come at the expense of significantly inferior piezoelectric coefficients, i.e., d$_{33}$<100 pC/N.

TABLE I

Piezoelectric properties comparison of BiScO$_3$—xPbTiO$_3$ ceramics, several commercial PZT systems, and alternative high temperture piezoelectric systems.

| Material | Structure | T$_c$ (° C.) | P$_R$ $\mu$C/cm$^2$ | E$_c$ kV/cm | d$_{33}$ pC/N |
|---|---|---|---|---|---|
| PZT-5A (soft) | Perovskite (MPB) | 330 | 36 | ~10–12 | ~400 |
| PZT-8 (hard) | Perovskite (MPB) | 330 | 25 | >15 | ~225 |
| PbNb$_2$O$_6$ (modified) | Tungsten Bronze | ~500 | — | — | ~85 |
| Na$_{0.5}$Bi$_{4.5}$Ti$_4$O$_{15}$ | Bismuth Layered | ~600 | — | — | 18 |
| LiNbO$_3$ | Corundum | 1150 | — | — | 6 |
| BiScO$_3$—xPbTiO$_3$ x = 62 | Perovskite (rhombo-hedral) | 420 | 28 | 17 | 290 |
| BiScO$_3$—xPbTiO$_3$ x = 64 | Perovskite (MPB) | 450 | 32 | 21 | 465 |
| BiScO$_3$—xPbTiO$_3$ x = 66 | Perovskite (tetragonal) | 460 | 23 | 25 | 260 |

Additional (1-x)BiMeO$_3$-xPbTiO$_3$ perovskite solid solution systems have been developed using the above-mentioned correlation between the tolerance factor and T$_C$. Initial evidence reinforces the direct relationship between strain limits and T$_C$, and their dependence on the tolerance factor, for these systems. Effort is under way to synthesize various (1-x)BiMeO$_3$-xPbTiO$_3$ solid solutions where Me is indium, yttrium, ytterbium, other rare earth metals, and combinations thereof, that also include magnesium and/or zirconium on the B-site.

Figure 9:
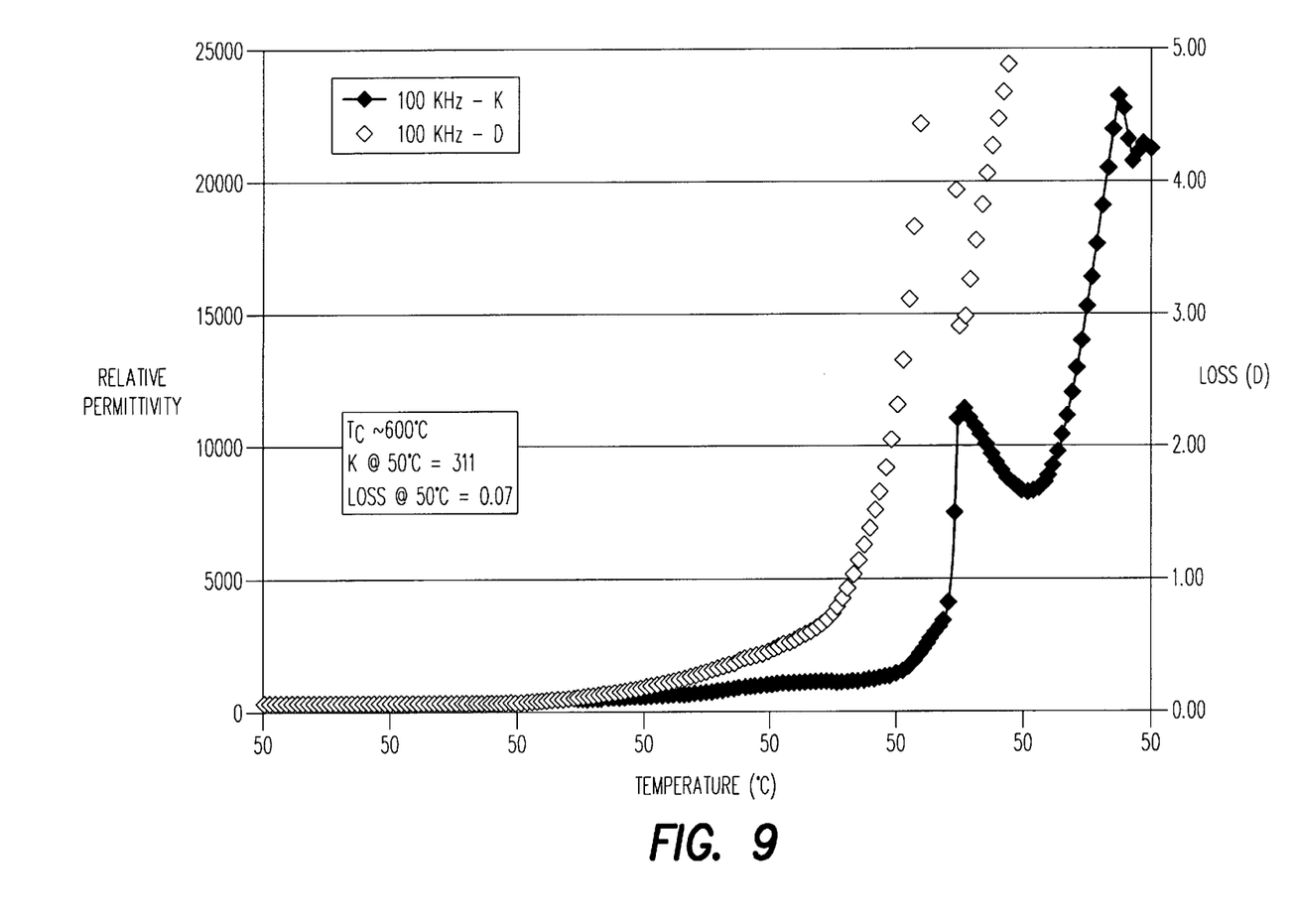
FIG. 9 is a graphical representation of the Curie temperature ($T_C$) for a perovskite having the formula $(1-x)\,BiInO_3\text{-}xPbTiO_3$, where the c/a ratio is about 1.078, according to the present invention.

Initial tests of the system (1-x) BiInO$_3$-xPbTiO$_3$, with x=0.80, demonstrated a T$_C$ of about 560° C., as depicted in FIG. 9.

Results for the system BiYbO$_3$-PbTiO$_3$, with x=0.90 have a predicted TC>600, as experimentally confirmed.

Predictions and measured values of tolerance factor, c/a ratio, and T$_C$ for several of these BiMeO$_3$ based systems are shown in Table II.

TABLE II

Tolerance factor and expected property values for (1-x)BiMeO$_3$—xPbTiO$_3$ systems.

| System | Tolerance Factor | Near MPB Properties | |
|---|---|---|---|
| | | C/A Ratio | T$_C$ |
| BiScO$_3$ | 0.91 | 1.023 | 450 |
| BiInO$_3$ | 0.885 | 1.077 | 560 |
| BiYbO$_3$ | 0.86 | ~1.10 | ~610 |

The engineering of these perovskite systems is a direct result of combining crystal chemistry and property relationships. These systems offer tremendous promise for high temperature, high strain use in ceramic piezoelectric devices and are a suitable replacement for PZT and in a number of Relaxor-PT single crystal applications. The similarity to the polycrystalline PZT system will allow customization of piezoelectric properties through alloy development analogous to available PZT compositions, i.e. dopant strategy to produce "hard" and "soft" piezoelectrics. The use of these structure property relationships also offers the possibility for the development of entirely non-lead based piezoelectric materials, a current area of tremendous interest to industry.

While we have shown and described several embodiments in accordance with our invention, it is to be clearly understood that the same is susceptible to numerous changes apparent to one skilled in the art. Therefore, we do not wish to be limited to the details shown and described but intend to show all changes and modifications, which come within the scope of the appended claims.

What is claimed is:

1. A perovskite of the general formula:

(1-x)BiMeO$_3$-xPbTiO$_3$ where x is a molar fraction between about 0.50 to 0.90; and Me is at least one cation selected from the group consisting of: indium, gallium, rare earth metals, magnesium, zirconium, and combinations thereof.

2. The perovskite of claim 1, wherein said perovskite is doped with an element selected from the group consisting of: lanthanum, iron, manganese, niobium, tin, barium, sodium, potassium, nickel, strontium, and combinations thereof.

3. The perovskite of claim 1, wherein said perovskite is polycrystalline and exhibits a morphotropic phase boundary between a rhombohedral structure on the bismuth-rich side and a tetragonal structure on the lead-rich side.

4. The perovskite of claim 1, wherein said cation is scandium.

5. The perovskite of claim 4, wherein x is in the range between about 0.62 to 0.66.

6. The perovskite of claim 5, wherein said perovskite has a piezoelectric coefficient about 450 pC/N and a Curie temperature greater than about 450° C.

7. The perovskite of claim 5, wherein said perovskite has a polarization greater than about 30 $\mu$C/cm$^2$.

8. The perovskite of claim 7, wherein said perovskite is exposed to minimum electric field reciuired to achieve maximum polarization.

9. The perovskite of claim 5, wherein said perovskite has a tolerance factor about 0.91.

10. The perovskite of claim 1, wherein said cation is indium.

11. The perovskite of claim 10, wherein said perovskite has a Curie temperature ($T_c$) about 560° C.

12. The perovskite of claim 10, wherein said perovskite has a tolerance factor about 0.885.

13. The perovskite of claim 1, wherein said cation is ytterbium.

14. The perovskite of claim 13, wherein said perovskite has a Curie temperature ($T_c$) about 610°C.

15. The perovskite of claim 3, wherein said perovskite has a tolerance factor about 0.86.

16. The perovskite of claim 1, wherein said rare earth metal is selected form the group consisting of: scandium and yttrium.

17. The perovskite of claim 1, wherein said lanthanide metal is selected from the group consisting of: lanthanum, cerium, praseodymium, neodymium, promethium, samarium, europium, gadolinium, terbium, dysprosium, holmium, erbium, thulium, ytterbium and lutetium.

18. The perovskite of claim 1, wherein said actinide metal is selected from the group consisting of: actinium, thorium, protactinium, uranium neptunium, plutonium, americium, curium, berkelium, californium, einsteinium, fermium, mendelevium, nobelium and lawrencium.

* * * * *

UNITED STATES PATENT AND TRADEMARK OFFICE
CERTIFICATE OF CORRECTION

PATENT NO. : 6,685,849 B2 Page 1 of 1
DATED : February 3, 2004
INVENTOR(S) : Eitel et al.

It is certified that error appears in the above-identified patent and that said Letters Patent is hereby corrected as shown below:

Column 7,
Line 13, "claim 3" is to be deleted and -- claim 13 -- is to be inserted.

Signed and Sealed this

Twenty-seventh Day of July, 2004

JON W. DUDAS
*Acting Director of the United States Patent and Trademark Office*